United States Patent [19]
Haykin et al.

[11] Patent Number: 5,027,123
[45] Date of Patent: Jun. 25, 1991

[54] ADAPTIVE INTERFERENCE CANCELLER

[76] Inventors: Simon Haykin, 475 Ontario Street, Ancaster, Ontario, Canada, L9G 3N6; Andrew Ukrainec, 28 Stroud Street, Hamilton, Ontario, Canada, L8S 1Z6

[21] Appl. No.: 529,457

[22] Filed: May 29, 1990

[30] Foreign Application Priority Data

Jun. 26, 1989 [CA] Canada .................. 603935

[51] Int. Cl.$^5$ .......................................... G01S 13/534
[52] U.S. Cl. .................................. 342/188; 342/363; 342/365; 342/384
[58] Field of Search ............... 342/188, 361, 362, 363, 342/365, 159, 384

[56] References Cited

U.S. PATENT DOCUMENTS

| | | | |
|---|---|---|---|
| 4,028,697 | 6/1977 | Albanese et al. | 342/159 |
| 4,035,797 | 7/1977 | Nagy | 342/104 |
| 4,106,014 | 8/1978 | Dunn | 342/188 |
| 4,107,678 | 8/1978 | Powell | 342/62 |
| 4,112,370 | 9/1978 | Monsen | 342/361 X |
| 4,264,908 | 4/1981 | Pelchat et al. | 342/364 |
| 4,283,795 | 8/1981 | Steinberger | 455/283 |
| 4,292,685 | 9/1981 | Lee | 455/12 |
| 4,293,945 | 10/1981 | Atia et al. | 455/67 X |
| 4,310,813 | 1/1982 | Yuuki et al. | 455/60 X |
| 4,369,519 | 1/1983 | Yuuki et al. | 455/60 |
| 4,438,530 | 3/1984 | Steinberger | 455/278 |
| 4,479,258 | 10/1984 | Namiki | 455/295 |
| 4,490,719 | 12/1984 | Botwin et al. | 342/64 |
| 4,606,054 | 8/1986 | Amitay et al. | 342/362 |
| 4,719,466 | 1/1988 | Farind et al. | 342/159 |
| 4,723,321 | 2/1988 | Saleh | 455/295 |
| 4,757,319 | 7/1988 | Lankl | 342/378 |
| 4,759,036 | 7/1988 | Meyers | 342/362 X |
| 4,766,435 | 8/1988 | Wells | 342/82 |
| 4,785,302 | 11/1988 | Ma et al. | 342/362 |
| 4,829,306 | 5/1989 | Gjessing et al. | 342/159 |
| 4,829,307 | 5/1989 | Jacomini | 342/159 |
| 4,849,762 | 7/1989 | Barnes | 342/188 |
| 4,853,702 | 8/1989 | Shiokawa et al. | 342/363 |
| 4,868,917 | 9/1989 | Woolcock | 342/26 |

Primary Examiner—John B. Sotomayor
Attorney, Agent, or Firm—Staas & Halsey

[57] ABSTRACT

An adaptive interference canceller for use in a dual polarized radar system for receiving cross-polar and like-polar signals and generating an output signal corresponding to the received cross-polar signal with a like-polar interfering component cancelled therefrom. A modified adaptive filter is provided with a self-adjusting impulse response conforming to a least means square adjustment cancelling the influence of the like-polar signal, which is generally much stronger on the cross-point signal. The resulting output has a high target-to-clutter ratio and therefor a high probability of detection.

11 Claims, 5 Drawing Sheets

ADAPTIVE CROSS-POLAR INTERFERENCE CANCELLER

DOFASCO

HORIZONTAL RETURN

VERTICAL RETURN

CANCELLED OUTPUT

MEDIUM PULSE

FIG.10.

ADAPTIVE CROSS-POLAR INTERFERENCE CANCELLER

LASALLE PARK

HORIZONTAL RETURN

VERTICAL RETURN

CANCELLED OUTPUT

SHORT PULSE

ADAPTIVE INTERFERENCE CANCELLER

FIELD OF THE INVENTION

The present invention relates to dual polarized radar systems, and more particularly to an adaptive interference canceller for cancelling a like-polar interference component from a received cross-polar radar signal.

BACKGROUND OF THE INVENTION

Dual polarized radar systems are well known for detecting targets in marine as well as other detection environments. Under normal operating conditions, a radar transmits a horizontally polarized pulse and receives both horizontal $U_{hh}$ (like-polar) and vertical $Y_{hv}$ (cross-polar) signals. However, such systems typically suffer from a cross-polar signal leakage problem due to performance limitations in the antenna and rotary joint of such prior art systems, as well as depolarization of the returned signal by the environment. The leakage transfer function can be modelled as a zero order system with varying gain.

One prior art technique for cancelling the cross-polar signal leakage comprises the step of simply subtracting the like-polar channel from the cross-polar channel arithmetically, thereby providing a measure of interference cancelling. However, as discussed above the signal leakage components typically vary depending on environmental conditions, etc. Thus, the simple arithmetic subtraction technique does not result in complete cancellation of the interference component.

U.S. Pat. No. 4,106,014 (Dunn) discloses a target signature analysis system for differentiating between targets based upon different effects of the return polarized signal. The pulse radar set transmits signals at +45° linear polarization and receives both +45° and −45° linear polarized signals. A detection is registered when the orthogonal polarization exceeds the like polarization return signal. This occurs primarily for horizontal and vertical dipole-like edges found in military vehicles.

The main thrust of the radar set as disclosed by Dunn is to find vertical and horizontal dipoles in the environment. The method used is not adaptive to the environment and depends on the orthogonal polarization exceeding that of the like polarization return signal.

U.S. Pat. No. 4,490,719 (Botwin et al) d missile guidance system which uses a process for comparing a horizontally polarized radar map to a vertically polarized radar map, noting which points on the map have equal returns for both polarizations, and then conveying these points on to a map matcher. The resultant information is used by the missile guidance system.

The Botwin et al system is based on the assumption that man-made objects return horizontal and vertical polarized signals roughly equal. Since man-made objects are often good navigational references, this information can be used within a missile guidance system. However, there is no disclosure of enhancing the difference in polarization and suppressing commonality between horizontal and vertical channels.

U.S. Pat. No. 4,035,797 (Nagy) discloses a polarized radar system for determining the complexity of targets (e.g. automobiles) in order to identify and discriminate between them. The system uses two quadrature frequencies and orthogonal polarizations to create a complexity measure of a received target signal. The output of the system is a sum of the absolute values of the various polarization ratios, the derivative of which is normalized by the range rate of change of the target.

Although the system of Nagy is sensitive to polarization, it uses the ratios between different polarizations to create a discriminant based on change of polarization information in range.

U.S. Pat. No. 4,028,697 (Albanese et al) describes a dynamic signal processing system using an adaptive filter to achieve enhanced target discrimination in clutter. Processing of the signal involves a time varying filter which can adapt to changes in clutter spectrum. Although the Albanese et al patent discloses means for processing the return signals to achieve a maximum signal to interference ratio, it does not utilize any information in a cross polarization channel. The adaptive time varying filter only makes use of correlations in the like channels, and therefore is not relevant to the problem of cross-polar signal leakage.

SUMMARY OF THE INVENTION

According to the present invention, an adaptive signal canceller is provided in which an adaptive filter effectively tracks any varying gain in the like-polar and cross-polar signals and compensates in response thereto, such that in the event of a disturbance in the orthogonal signal channel, such a disturbance will appear in the output even if it does not exceed the like-polar signal in amplitude. Thus, the system of the present invention enhances differences between polarizations and reduces effects common to both polarizations. This has a direct application to the enhancement and detection of a target which reflects incident signals from one polarization to the other.

The adaptive filter of the present invention operates on baseband log video signals of the like-polar and cross-polar channels. Since the information of interest is in the cross-polar channel, the impulse response of the adaptive filter adjusts itself in a least means square manner to cancel the influence of the like-polar channel on the cross-polar baseband log video signal. The resulting output has a high target-to-clutter ratio and therefore an increased probability of detection. Both continuous (analogue) and discrete (digital) implementations of the adaptive interference canceller are described herein below.

The adaptive interference canceller of the present invention effectively compensates for mediocre performance of dual polarization antenna and rotary joint and thereby provides a performance approaching that of much more expensive antennae. Moreover, due to its adaptive nature, the interference canceller of the present invention compensates for receiver gain drifts as well as other radar system changes.

The concept of adaptive noise cancellation was originated at Stanford University in 1965, and is described in detail in an article by B. Widrow et al entitled "Effective Noise Cancelling: Principles and Applications", Proceedings of the IEEE, Volume 63, No. 12, Dec. 1975, pages 1692-1716.

Additional descriptions of adaptive signal cancelling may be found in the text by Haykin, S. entitled "Adaptive Filter Theory", Hall, Inglewood Cliffs, New Jersey, 1986; and Widrow, B. et al, entitled "Adaptive Signal Processing", Hall, Inglewood Cliffs, New Jersey, 1985.

In accordance with an aspect of the present invention there is provided an adaptive interference canceller for use in a dual polarized radar system for detecting a first polarized signal in the presence of a second orthogonal polarized signal, wherein the first polarized signal contains an interference component in the form of a variable gain version of the second orthogonal signal. The adaptive interference canceller includes an adaptive filter with self-adjusting impulse response for filtering the second orthogonal polarized signal and in response generating an adaptive weighted version of the second signal, and circuitry for subtracting the adaptive weighted second signal from the first polarized signal and in response generating an output signal corresponding to the first polarized signal with the interference component cancelled therefrom.

In accordance with an additional aspect of the invention, there is provided a dual polarized radar system for receiving a first polarized signal $Y_{hv}$ and second orthogonal polarized signal $X_{hh}$, the first signal $Y_{hv}$ containing a variable interference component of the second signal $X_{hh}$, and in response generating an output signal $e_{hv}$ corresponding to the first signal $Y_{hv}$ with the interference substantially cancelled therefrom. The radar system includes a first antenna for receiving the first signal, a second antenna for receiving a second signal and circuitry for converting the first and second signals into respective first and second analogue baseband video signals $d_{hv}(t)$ and $u_{hh}(t)$. An adaptive filter is included for receiving the second baseband video signal and the output signal and in response generating an adaptive signal $w(t)$ in accordance with the equation:

$$w(t) = \mu \int_0^T u_{hh}(t) e_{hv}(t) dt + w(o)$$

wherein is initial condition constant and $\mu$ is an adaptation coefficient conforming to the relation $$0^L \mu^L \frac{2}{\alpha_u^2},$$

wherein $\alpha^2_\mu$ is the power of said second baseband video signal $u_{hh}(t)$. Circuitry is included for multiplying the second baseband video signal by the adaptive signal and in response generating an adaptive weight adjusted video signal $w(t) u_{hh}(t)$. Circuitry is also provided for subtracting the adaptive weight adjusted video signal from the first baseband video signal and in response generating the output signal $e_{hv}(t)$.

BRIEF DESCRIPTION OF THE DRAWINGS

A preferred embodiment of the present invention will be described in greater detail below with reference to the following drawings in which.

DETAILED DESCRIPTION OF THE INVENTION

Figure 1:
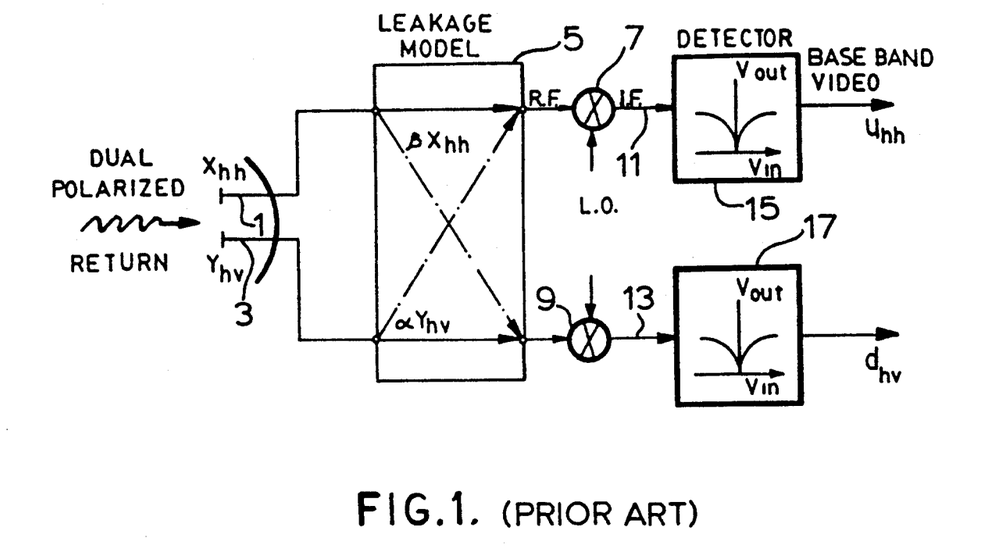
FIG. 1 is a signal model of a dual polarization radar system in accordance with the prior art.

Turning to FIG. 1, a signal model of a standard dual polarized radar system is shown incorporating first and second radar antennae 1 and 3 for receiving horizontal horizontal (i.e. like-polar) and vertical (i.e. cross-polar) radar signals $X_{hh}$ and $Y_{hv}$ in response to transmission of a horizontally polarized initial signal. As shown in the block labelled 5, a portion $\alpha Y_{hv}$ of the cross-polar signal typically leaks into the received like-polar signal $X_{hh}$. Likewise, a portion $\beta X_{hh}$ of the like-polar signal leaks into the received cross-polar signal $Y_{hv}$. As discussed above, such leakage may result from performance limitations in the antennae 1 and 3 as well as the rotary joint (not shown) of such prior art systems. Additionally, a certain amount of depolarization of the vertical (i.e. cross-polar) signals occurs due to the environment. The received radar signals are multiplied with a local oscillator (L.O.) signal via multipliers 7 and 9 in a well known manner, resulting in respective intermediate frequency signals on channels 11 and 13. The intermediate frequency (I.F.) signals are then applied to respective logarithm detectors 15 and 17 for generating respective baseband log video like-polar and cross-polar signals $u_{hh}$ and $d_{hv}$, respectively.

As discussed hereinabove, the signals of interest in such radar systems are found in the cross-polar channel. Accordingly, part of the cross-polar component may be thought of as the desired signal and the like-polar component as the interfering signal.

As will described in greater detail below with reference to FIGS. 2 and 3, in accordance with the present invention, the baseband like-polar and cross-polar video signals are processed via an adaptive interference canceller for cancelling the influence of the like-polar signal $\beta X_{hh}$ on the received cross-polar information signal $Y_{hv}$.

Figure 2:
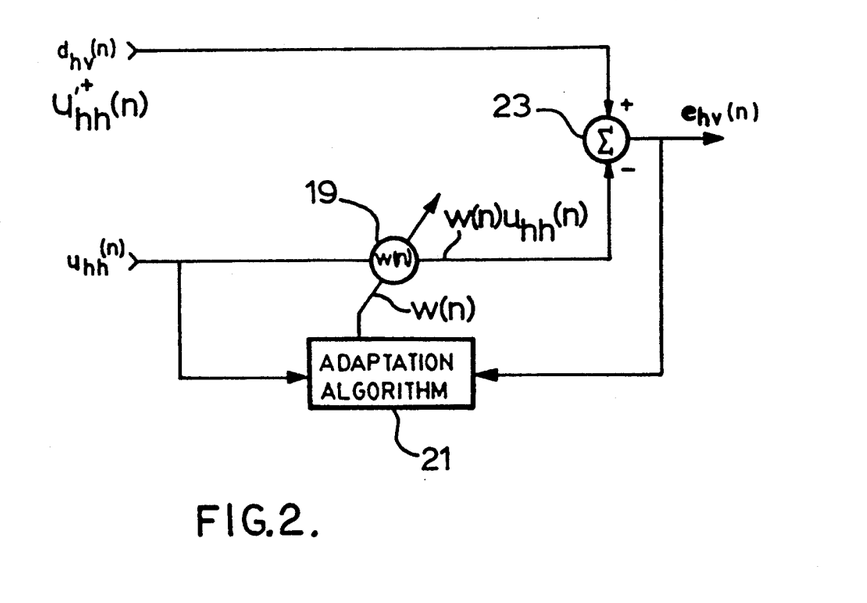
FIG. 2 is a signal model of a discrete time embodiment of the adaptive interference canceller of the present invention.

Turning to the digital embodiment of FIG. 2, the desired signal $d_{hv}(n)$ includes an interference signal $u'_{hh}(n)$ corresponding to the received analogue interference component $\beta X_{hh}$, which forms a primary input to the discrete time (digital) canceller. The second input to the canceller receives the digitized like-polar $u_{hh}(n)$ signal which need not be correlated with the cross-polar signal $d_{hv}(n)$ but is correlated in some unknown way with the interference signal $u'_{hh}(n)$. The like-polar signal $u_{hh}(n)$ is filtered via digital multiplier 19 to produce an output signal $w(n) \cdot u_{hh}(n)$ which closely resembles the interference signal $u'_{hh}(n)$. This output signal is then subtracted from the primary input signal $d_{hv}(n) + u'_{hh}(n)$ within a digital summer 23 to produce the system output signal $$e_{hr}(n) = dh v(n) + u'hh(n) - w(n) \cdot unn(n)$$

Since the characteristics of the cross-polar signal leakage path are unknown and typically of variable gain, design of a fixed filter is not feasible. Thus, in accordance with the principles of the present invention, the like-polar signal $u_{hh}(n)$ is processed via the adaptive filter formed from multiplier 19 and adaption algorithm circuit 21.

An adaptive filter differs from a fixed filter in that it automatically adjusts its own impulse response, or in the case of a discrete time implementation, its digital filter tap weight w(n). Adjustment is accomplished through the aforementioned algorithm which responds to the error output signal $e_{hv}(n)$ which is dependent, among other things, on the filter output. Thus, with the proper algorithm, the filter can operate under changing conditions and can re-adjust itself continuously to minimize the error signal $e_{hv}(n)$.

Hence, the adaptive interference canceller operates to produce a system output signal $e_{hv}(n)=d_{hv}(n)+u'_{hh}(n)-w(n)\cdot u_{hh}(n)$ that is a best fit in the least squares sense to the signal $d_{hv}(n)$. This objective is accomplished by feeding the system output $e_{hv}(n)$ back to the adaptive filter and adjusting the filter through a least means square adaptive algorithm via circuit 21 to minimize total system output power. In other words, the system output $e_{hv}(n)$ serves as the error signal input for the adaptive process.

The adaptive algorithm for generating the tap weight w(n) is characterized by the following discrete equation: $w(n+1)=w(n)+\mu u_{hh}(n)\cdot e_{hv}(n)$; wherein $\mu$ is an adaptation constant and w(O) is assumed to be zero.

The adatption constant, $\mu$, controls the response time of the adaptive filter. If a short pulse is transmitted by the radar, a faster response, or shorter time constant, is required from the adaptive intereference canceler, and therefore a larger value of $\mu$ is required. If a longer pulse is transmitted by the radar, a slower response is required, or longer time constant, and therefore a smaller value of, $\mu$ is required. This observation is based on the assumption that all other parameters of the radar system remain constant (e.g. amplitude).

Therefore, by adjusting $\mu$ the filter response time may be controlled to prevent partial cancellation of the target in the event of the filter adapting faster the target length time, reducing the target-to-clutter ratio. Accordingly, the adapation constant is chosen based on the pulse width transmitted by the radar.

Figure 3:
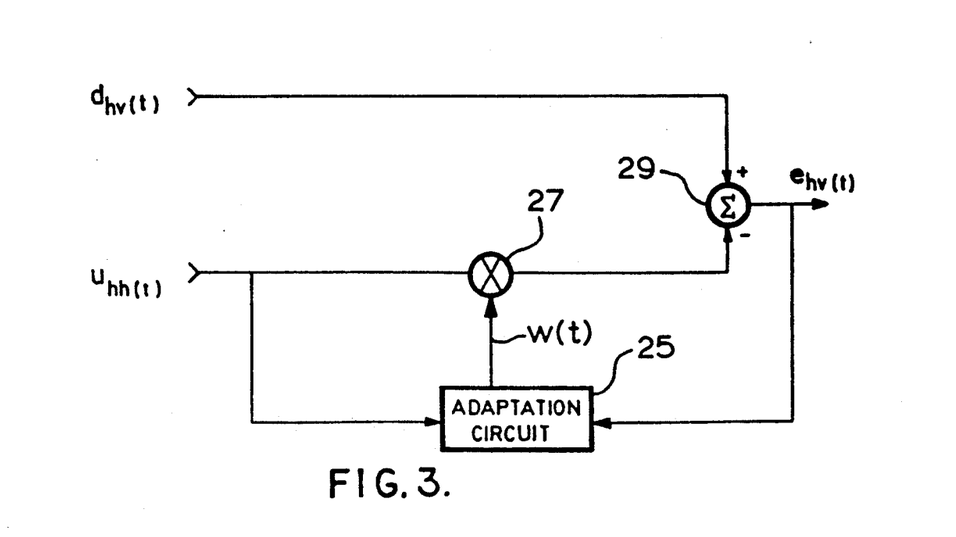
FIG. 3 is a signal model of a continuous time embodiment of the adaptive interference canceller of the present invention.

Turning to FIG. 3, a continuous time implementation of the adaptive interference canceller is shown comprising an adaptation circuit 25 for receiving the like-polar signal $u_{hh}(t)$ and the output error signal $e_{hv}(t)$ and in response generating an adaptive weighted coefficient signal w(t) in accordance with the following continuous time equation:

$$w(t) = \mu \int_0^T u_{hh}(t)e_{hv}(t)dt + w(o);$$

wherein $\mu$ is a constant and $a_4^2$ = power of $u_{hh}$ signal.

The like-polar signal $u_{hh}(t)$ is multiplied by the coefficient signal w(t) within the multiplier 27 to produce a product signal $w(t)\cdot u_{hh}(t)$ which adaptively tracks the like-polar interference component within the cross-polar information signal $d_{hv}(t)$. The product signal is then subtracted from the cross-polar signal at summing node 29 to produce the output signal $e_{hv}(t)=d_{hv}(t)-w(t)\cdot u_{hh}(t)$.

Figure 4:
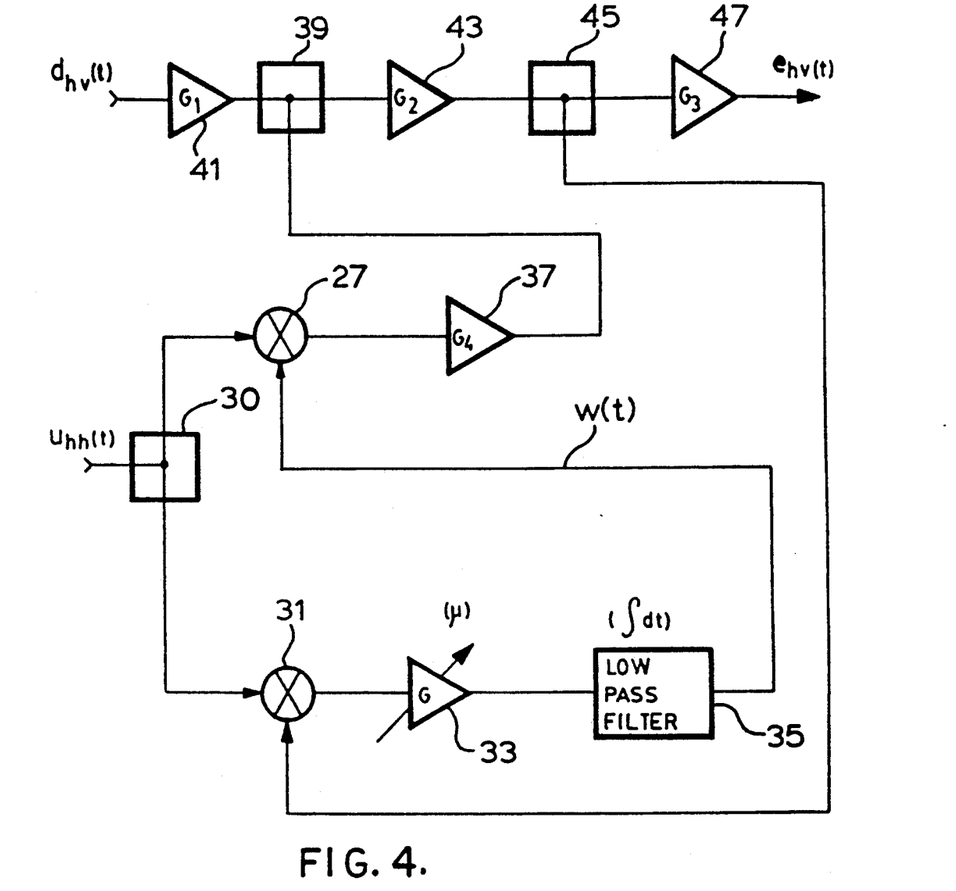
FIG. 4 is a hardware block diagram of a continuous time adaptive interference canceller in accordance with the preferred embodiment.

With reference to FIG. 4, a hardware block diagram of the preferred embodiment is shown in which the adaptation circuit 25 of FIG. 3 comprises a multiplier 31, variable gain amplifier or buffer 33 and low-pass filter 35. The adaptive signal w(t) is multiplied with the like-polar baseband video signal $u_{hh}(t)$ in multiplier 27 and gain adjusted via amplifier 37 for application to combiner 39 which operates as a subtractor.

The cross-polar information video signal $d_{hv}(t)$ is buffered via amplifier 41 and applied to combiner 39, which in response generates an output signal of the form $d_{hv}(t)-w(t)\cdot u_{hh}(t)$, which is then further level adjusted via amplifier 43 for application to signal divider 45. The level adjusted signal from amplifier 43 is buffered via amplifier 47 for generating the final output error signal $e_{hv}(t)$. The signal tapped off of divider 45 is fed back to multiplier 31 for application to the adaptive filter.

Figure 5:
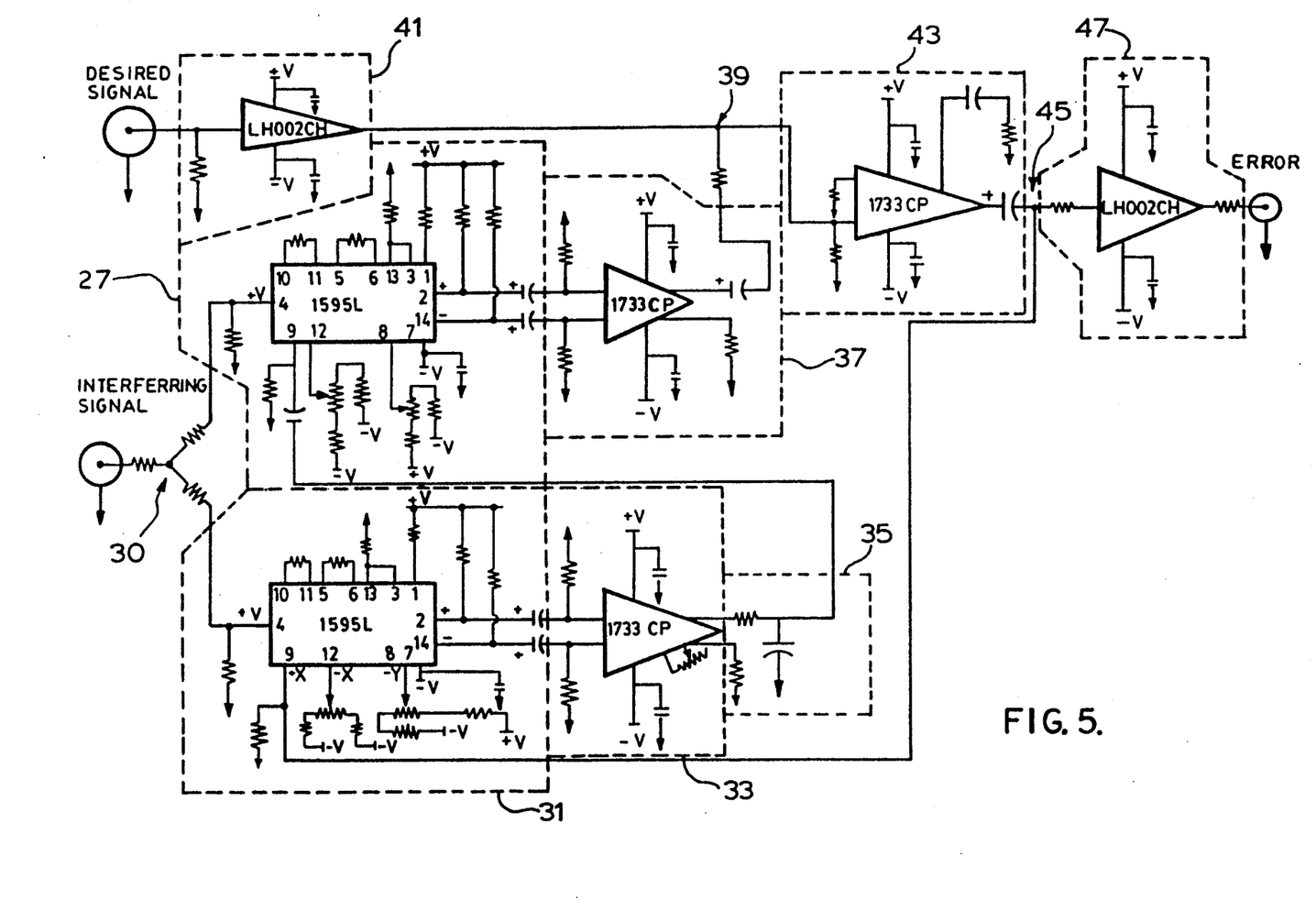
FIG. 5 is a hardware schematic of the adaptive interference canceller of FIG. 4.

The continuous time adaptive interference canceller of FIG. 4 is shown in schematic form with reference to FIG. 5. The reference numerals in FIGS. 4 and 5 are consistent, additional schematic detail being provided within the dash-lined boxes of FIG. 5.

Figure 6:
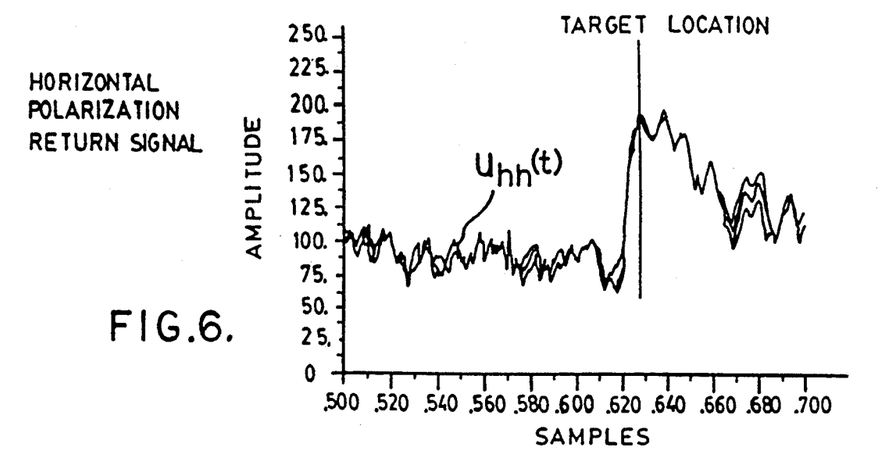
FIGS. 6–8 are example sweeps of discrete radar data collected during a sample run of the adaptive interference canceller according to the preferred embodiment.
Figure 7:
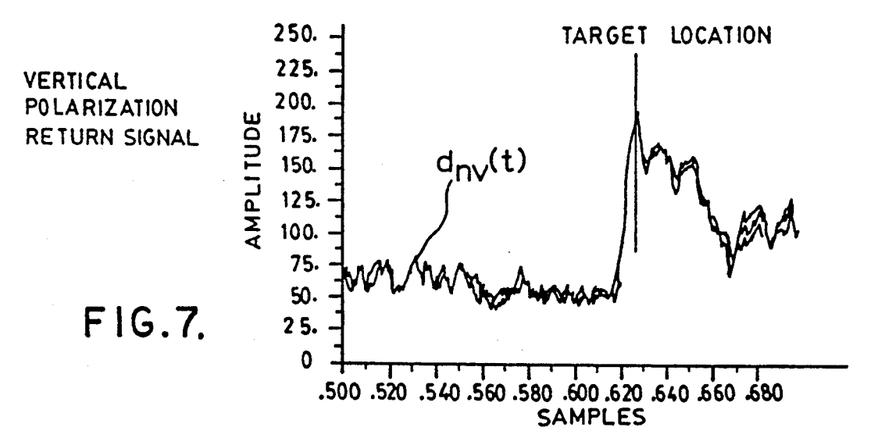
Figure 8:
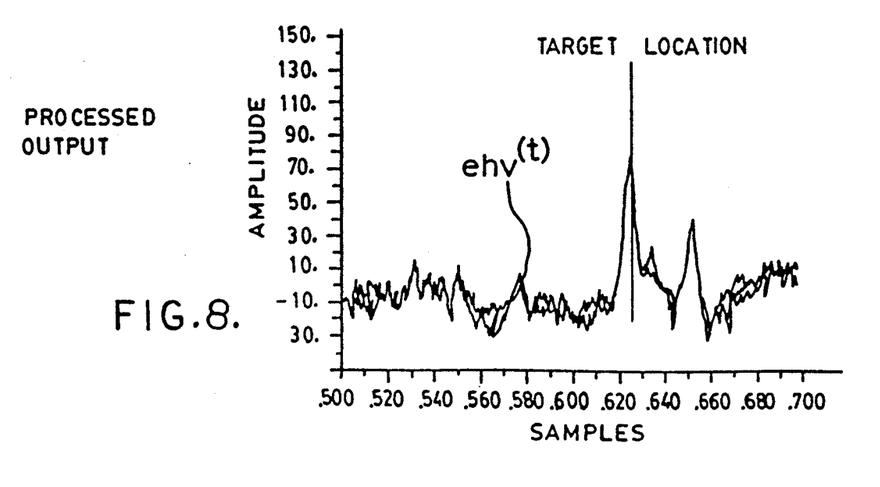

FIG. 6 illustrates a sample radar sweep showing the horizontal or like-polar return signal $u_{hh}(t)$ and FIG. 7 shows an actual radar sweep of the vertical or cross-polar return signal $d_{hv}(t)$. Likewise, FIG. 8 illustrates the processed cross-polar derived error signal $e_{hv}(t)$ in which the target location is clearly depicted.

Figure 9:
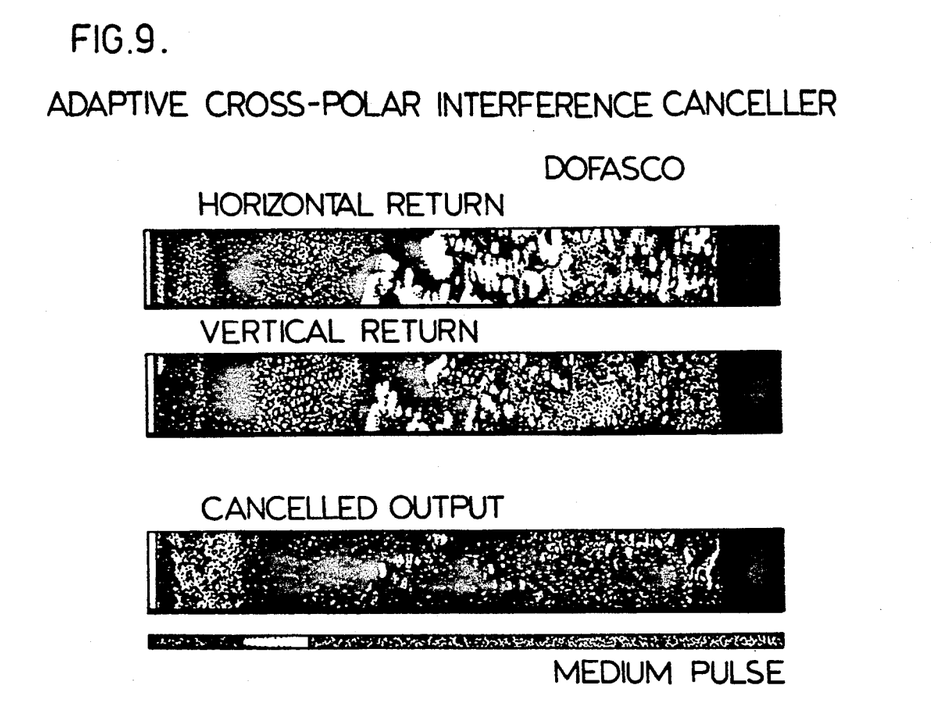
FIGS. 9 and 10 are photographic reproductions of actual processed radar samples obtained during use of the adaptive interference canceller of the present invention.
Figure 10:
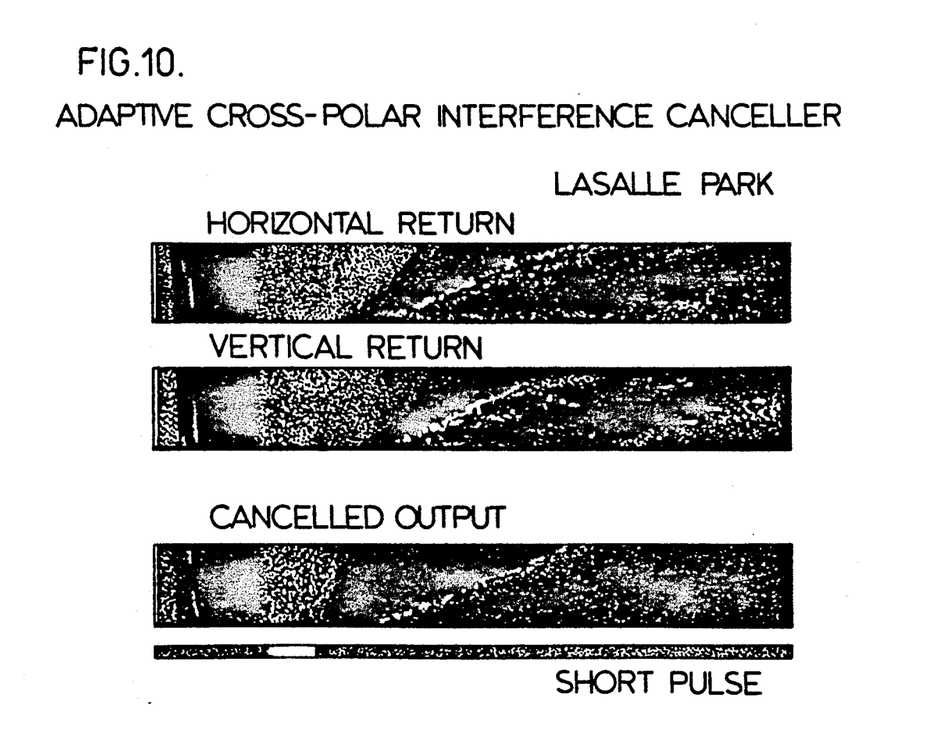

Turning finally to FIGS. 9 and 10, photographic representations are shown of processed data in which FIG. 9 is an image of a target detected using the radar system of the present invention operating in medium pulse mode, which results in longer pulse width and brighter, but less detailed image. The surroundings are of a heavily industrialized area.

FIG. 10 illustrates the processed data received for the radar system of the present invention operating in short pulse mode, which results in a more detailed image. The area is relatively benign, being close to a conservation park.

In both FIGS. 9 and 10, the target appears clearly in the processed output, approximately in the centre of the subimage.

A preferred application of the adaptive interference canceller of the present invention is in the implementation of a polarimetric radar for accurate navigation (PRAN) system. In such a system, it is required to enhance the detectability of a target reflector which is able to twist the polarization of a cross-polar radar signal. A set of these reflectors can advantageously be placed along a confined waterway, such as a canal or seaway. With prior knowledge of the exact location of such reflectors and using a sufficiently short pulse width radar, a ship can then interrogate the reflectors via radar and make use of the information for navigational purposes.

Alternative embodiments and variations of the present invention are contemplated. All such embodiments or variations are believed to be within the scope of the claims appended hereto.

I claim:

1. In a dual polarized radar system for transmitting a signal in a predetermined polarization plane, receiving cross-polar and like-polar reflected signals, and detecting said cross-polar signal in the presence of said like-polar signal, wherein said cross-polar signal contains an interference component in the form of a variable gain version of said like-polar signal, an adaptive interference canceller, comprising:

(a) an adaptive filter with a self-adjusting impulse response for filtering said like-polar signal and in response generating an adaptive weighted version of said like-polar signal; and (b) means for subtracting said adaptive weighted like-polar signal from said cross-polar signal and in response generating an output signal corresponding to said cross-polar signal with said interference component cancelled therefrom.

2. An adaptive interference canceller as defined in claim 1, wherein said adaptive filter further comprises adaptation means for receiving said output signal and in response adjusting said impulse response in accordance with a least-means-squared algorithm for minimizing output power of said output signal.

3. An adaptive interference canceller as defined in claim 2, wherein said adaptation means comprises a discrete time adaptation algorithm for effecting digital cancelling of said interference component from said cross-polar signal.

4. An adaptive interference canceller as defined in claim 1, further comprising:
  (a) means for multiplying said like-polar signal by said output signal and in response generating a first product signal;
  (b) means for amplifying said first product signal with a self-adaptive gain and in response generating a compensation coefficient signal;
  (c) means for low pass filtering said compensation coefficient signal and in response generating an adaptive weight adjustment signal;
  (d) a multiplier for multiplying said like-polar signal by said adaptive weight adjustment signal and in response generating an adaptive weight adjusted version of said like-polar signal; and
  (e) means for subtracting said adaptive weight adjusted version of said like-polar signal from said cross-polar signal and in response generating said output signal.

5. A dual polarized radar system for receiving a first polarized signal $Y_{hv}$ and a second orthogonal polarized signal $X_{hh}$, said first signal $Y_{hv}$ containing a variable interference component of said second signal $X_{hh}$, and in response generating an output signal corresponding to said first signal $Y_{hv}$ with said interference component substantially cancelled therefrom, comprising:
  (a) a first antenna for receiving said first signal $Y_{hv}$;
  (b) a second antenna for receiving said second signal $X_{hh}$;
  (c) means for converting said first and second signals $Y_{hv}$ and $X_{hh}$ into respective first and second analog baseband video signals $d_{hv}(t)$ and $u_{hh}(t)$;
  (d) an adaptive filter for receiving said second baseband video signal $u_{hh}(t)$ and said output signal $e_{hv}(t)$ and in response generating an adaptive weight adjustment signal $w(t)$ in accordance with the equation $$w(t) = \mu \int_0^T u_{hh}(t)e_{hv}(t)dt + w(o);$$

wherein $w(o)$ is an initial condition constant and $\mu$ is an adaptation coefficient conforming to the relation $$0 L \mu L \frac{2}{a_u^2},$$

wherein $a_\mu^2$ is the power of second baseband video signal $u_{hh}(t)$;
  (e) means for multiplying said second baseband video signal $u_{hh}(t)$ by said adaptive weight adjustment signal $w(t)$ and in response generating an adaptive weight adjusted video signal $w(t) u_{hh}(t)$; and
  (f) means for subtracting said adaptive weight adjusted signal from said first baseband video signal $d_{hv}(t)$ and in response generating said output signal in the form $e_{hv}(t) = d_{hv}(t) - w(t).u_{hh}(t)$.

6. A dual polarized radar system for receiving a first polarized signal $Y_{hv}$ and a second orthogonal polarized signal $X_{hh}$, said first signal $Y_{hv}$ containing a variable interference component of said second signal $X_{hh}$, and in response generating an output signal corresponding to said first signal $Y_{hv}$ with said interface component substantially cancelled therefrom, comprising:
  (a) a first antenna for receiving said first signal $Y_{hv}$;
  (b) a second antenna for receiving said second signal $X_{hh}$;
  (c) means for converting said first and second signals $Y_{hv}$ and $X_{hh}$ into respective first and second baseband video signals $d_{hv}(h)$ and $u_{hh}(u)$;
  (d) an adaptive filter for receiving said second baseband digital video signal $u_{hh}(t)$ and said output signal $e_{hv}(n)$ and in response generating an adaptive digital filter tap weight $w(n)$ in accordance with the difference equation $$w(n+1) = w(n) = \mu u_{hh}(u).e_{hv}(n),$$

wherein $\mu$, is an adaptation constant;
  (e) means for multiplying said second baseband video signal $u_{hh}(n)$ by said adaptive digital filter tap weight $w(n)$ and in response generating an adaptive weight adjusted video signal $w(n).u_{hh}(n)$; and
  (f) means for subtracting said adaptive weight adjusted video signal from said first baseband digital video signal and in response generating said output signal in the form $e_{hv}(n) = d_{hv}(n) - w(n).u_{hh}(n)$.

7. A dual radar system as defined in claim 5 wherein said first polarized signal $Y_{hv}$ is a cross-polar radar signal and said second orthogonal polarized signal $X_{hh}$ is a like-polar radar signal.

8. A dual polarized radar system as defined in claim 5 wherein said adaptive filter implements a least-means-square adjustment of its impulse response.

9. A dual polarized radar system as defined in claim 6 wherein said adaptive filter implements at least-means-square adjustment of said tap weight $w(n)$.

10. A dual polarized radar system for transmitting a signal in a predetermined polarization plane and detecting a first signal which is cross-polar relative to said predetermined polarization plane, said first signal being detected in the presence of a second signal which is like-polar relative to said predetermined polarization plane, wherein said first signal includes a variable interference component of said second signal, comprising:
  (a) a first antenna oriented to receive said first signal;
  (b) a second antenna oriented to receive said second signal; and
  (c) an adaptive interference canceller connected to said first antenna and said second antenna for filtering said first and second signals in accordance with a self-adjusting impulse response, and in response generating an output signal in the form of said first signal with said orthogonal variable interference component of said second signal substantially cancelled therefrom.

11. A dual polarized radar system as defined by claim 10, wherein said adaptive interference canceller further comprises means for adaptive filtering said second signal responsive to variations in said output signal and in response generating an adaptive weight adjusted version of said second signal, and means for subtracting said adaptive weight adjusted version of said second signal from said first signal and in response generating said output signal.

* * * * *

UNITED STATES PATENT AND TRADEMARK OFFICE
CERTIFICATE OF CORRECTION

Page 1 of 2

PATENT NO. : 5,027,123
DATED : June 25, 1991
INVENTOR(S) : Simon Haykin et al.

It is certified that error appears in the above-identified patent and that said Letters Patent is hereby corrected as shown below:

Col. 1, line 47, "d" s/b --discloses a--.

Col. 3, line 31, the equation,

"$\mu_0^T$" s/b -- $\mu \int_0^T$ --;

line 34, "is" (first occurrence) is s/b --w(0) is an--;

line 37, "$\alpha$" s/b --$\sigma$--;

line 41, $\alpha_\mu^2$" s/b --$\sigma_u^2$--.

* Col. 4, line 13, "horizontal" s/b deleted;

* line 39, after "will" insert --be--;

line 61, equation

"dhv(n)" s/b --$d_{hv}(n)$--;

"u'hh(n)" s/b --$u'_{hh}(n)$--;

"unn(n)" s/b --$u_{hh}(n)$--.

* Col. 5, line 29, "intereference" s/b --interference--;

line 33, "of," s/b --of--;

line 51, equation, "$\mu_0^T$" s/b --$\mu \int_0^T$ --;

line 54, $\alpha_4^2$" s/b --$\sigma_4^2$--.

UNITED STATES PATENT AND TRADEMARK OFFICE
CERTIFICATE OF CORRECTION

PATENT NO. : 5,027,123

DATED : June 25, 1991

INVENTOR(S) : Simon Haykin et al.

It is certified that error appears in the above-identified patent and that said Letters Patent is hereby corrected as shown below:

Col. 7, line 59, equation, "$\mu_0^T$" s/b -- $\mu \int_0^T$ --;

line 67, "$\alpha_u^2$" s/b --$\sigma_u^2$--.

Col. 8, line 1, "$\alpha_\mu^2$" s/b --$\sigma_\mu^2$--;

\* line 42, "5" s/b --5,--;

\* line 46, "5" s/b --5,--;

\* line 49, "6" s/b --6,--.

Signed and Sealed this

Sixth Day of April, 1993

Attest:

STEPHEN G. KUNIN

Attesting Officer    Acting Commissioner of Patents and Trademarks